United States Patent
Cho et al.

(10) Patent No.: US 7,663,226 B2
(45) Date of Patent: Feb. 16, 2010

(54) HEAT-RELEASING PRINTED CIRCUIT BOARD AND SEMICONDUCTOR CHIP PACKAGE

(75) Inventors: Seung-Hyun Cho, Seoul (KR); Seung-Chul Kim, Cheongju-si (KR); Sang-Soo Lee, Seoul (KR); Jung-Woo Lee, Seoul (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 89 days.

(21) Appl. No.: 12/010,643

(22) Filed: Jan. 28, 2008

(65) Prior Publication Data
US 2009/0085193 A1    Apr. 2, 2009

(30) Foreign Application Priority Data
Sep. 28, 2007    (KR) .................... 10-2007-0098381

(51) Int. Cl.
*H01L 23/12* (2006.01)
*H01L 23/053* (2006.01)
(52) U.S. Cl. .................... 257/701; 257/698; 977/742
(58) Field of Classification Search ................ 257/698, 257/700, 758; 977/742, 788
See application file for complete search history.

(56) References Cited

U.S. PATENT DOCUMENTS

| 6,897,009 | B2 * | 5/2005 | Johnson et al. | 430/315 |
| 6,946,410 | B2 * | 9/2005 | French et al. | 438/800 |
| 7,253,431 | B2 * | 8/2007 | Afzali-Ardakani et al. | 257/20 |
| 2004/0238887 | A1 * | 12/2004 | Nihey | 257/347 |
| 2006/0105523 | A1 * | 5/2006 | Afzali-Ardakani et al. | 438/257 |

FOREIGN PATENT DOCUMENTS

JP    2002-9213 A    1/2002
KR    10-2007-0065789    6/2007

OTHER PUBLICATIONS

Korean Office Action issued on Jan. 28, 2009 in corresponding Korean Patent Application 10-2007-0098381.

* cited by examiner

*Primary Examiner*—S. V Clark

(57) ABSTRACT

A heat-releasing printed circuit board and semiconductor chip package are disclosed. The heat-releasing printed circuit board includes an insulation layer, on a surface of which a circuit pattern is formed, and a solder resist, which is stacked on the insulation layer, where the solder resist contains carbon nanotubes. The heat-releasing printed circuit board allows the heat generated in a semiconductor chip to be dispersed in several directions of the board or package, to improve heat-releasing property.

14 Claims, 3 Drawing Sheets

HEAT-RELEASING PRINTED CIRCUIT BOARD AND SEMICONDUCTOR CHIP PACKAGE

CROSS-REFERENCE TO RELATED APPLICATIONS

This application claims the benefit of Korean Patent Application No. 10-2007-0098381 filed with the Korean Intellectual Property Office on Sep. 28, 2007, the disclosure of which is incorporated herein by reference in its entirety.

BACKGROUND

1. Technical Field

The present invention relates to a heat-releasing printed circuit board and a semiconductor chip package.

2. Description of the Related Art

The demands in current printed circuit boards are closely related to the trends of faster performance and higher densities in the electronics market, and to satisfy such demands, the printed circuit board faces several tasks, such as providing finer circuits, superior electrical properties, higher reliability, higher signal transfer speeds, and greater functionality, etc.

In particular, in a device such as a mobile phone, server, network, etc., which provides faster speeds and higher power consumption while being implemented in a higher density and smaller size, efficient heat release is becoming an important issue for improving product reliability and preventing malfunctions. This is because high temperatures in a semiconductor chip can be a major cause of errors such as malfunctioning and halting in a device.

Methods in the related art for lowering the temperature of a semiconductor chip include a method of installing a heat sink over the semiconductor chip that emits high levels of heat, and a method of operating a cooling fan to force out the large amounts of heat.

FIG. 1 is a cross-sectional view of a semiconductor chip package according to the related art. Referring to FIG. 1, a semiconductor chip 104 is mounted on a printed circuit board 102 by way of solder bumps 106, etc., and an underfill is injected between the semiconductor chip 104 and the printed circuit board 102 to increase the adhesion between the semiconductor chip 104 and the printed circuit board 102. After the semiconductor chip 104 is mounted on the printed circuit board 102, a molding material 108 is coated on which encapsulates the semiconductor chip 104. Also, solder balls 110 are coupled on, and the semiconductor chip 104 package is mounted on the main board by a flip chip method, etc.

Looking at the path through which the heat generated in the semiconductor chip travels, in a semiconductor chip package according to the related art, heat is generated in the semiconductor chip due to the operation of the product in which the semiconductor chip package is equipped, and this heat travels through the solder bumps and the circuits of the board to the solder balls connected to the main board. This path of heat flow does not efficiently release the high levels of heat generated in the semiconductor chip and board. As such, in the related art, heat-releasing vias penetrating the printed circuit board are formed in the joint portions between the semiconductor chip and the printed circuit board to reduce the path of heat flow, or a metal core is inserted within the printed circuit board to release heat from the sides of the printed circuit board.

However, the insulation material of the printed circuit board is generally very low in thermal conductivity, and hence acts as a large resistance to the movement of heat, hindering efficient heat release.

Also, whereas effective heat release requires heat emission in all directions of the printed circuit board, the solder resist coated on the outermost layers of the printed circuit board is also low in thermal conductivity, making it difficult to efficiently release the heat generated in the board.

Moreover, the molding material encapsulating the semiconductor chip also has a low thermal conductivity, so that the heat generated in the semiconductor chip is released only through the printed circuit board, for inefficient heat release.

SUMMARY

An aspect of the invention is to provide a heat-releasing printed circuit board and semiconductor chip package, which allow heat generated in a semiconductor chip to be dispersed in several directions of the board and the package, to improve heat-releasing performance.

One aspect of the invention provides a heat-releasing printed circuit board that includes an insulation layer, on a surface of which a circuit pattern is formed, and a solder resist, which is stacked on the insulation layer, where the solder resist contains carbon nanotubes.

Multiple insulation layers may be stacked, while the solder resist may be stacked on at least one of the outermost layers of the insulation layers.

The solder resist may contain 0.1 to 1 parts by weight of the carbon nanotubes per 100 parts by weight of the solder resist.

The insulation layer may also contain carbon nanotubes. In this case, the insulation layer may contain 0.1 to 1 parts by weight of the carbon nanotubes per 100 parts by weight of the insulation layer.

Another aspect of the invention provides a semiconductor chip package that includes a semiconductor chip, an insulation layer on which the semiconductor chip is to be mounted and on a surface of which a circuit pattern is formed, and a solder resist stacked on the insulation layer, where the solder resist contains carbon nanotubes.

More than one insulation layer may be stacked, and the solder resist may be stacked on at least one of the outermost layers of the insulation layers.

The solder resist may contain 0.1 to 1 parts by weight of the carbon nanotubes per 100 parts by weight of the solder resist.

The insulation layer may also contain carbon nanotubes. In this case, the insulation layer may contain 0.1 to 1 parts by weight of the carbon nanotubes per 100 parts by weight of the insulation layer.

An underfill may be interposed between the semiconductor chip and the insulation layer, and the underfill may contain carbon nanotubes. In this case, the content of the carbon nanotubes in the underfill can be 0.1 to 1 parts by weight of the carbon nanotubes per 100 parts by weight of the insulation layer.

The semiconductor chip package, according to certain embodiments of the invention may further include a molding material which encapsulates the semiconductor chip, where the molding material may contain carbon nanotubes. In this case, the molding material may contain 0.1 to 1 parts by weight of the carbon nanotubes per 100 parts by weight of the insulation layer.

Additional aspects and advantages of the present invention will be set forth in part in the description which follows, and in part will be obvious from the description, or may be learned by practice of the invention.

DETAILED DESCRIPTION

Figure 1:
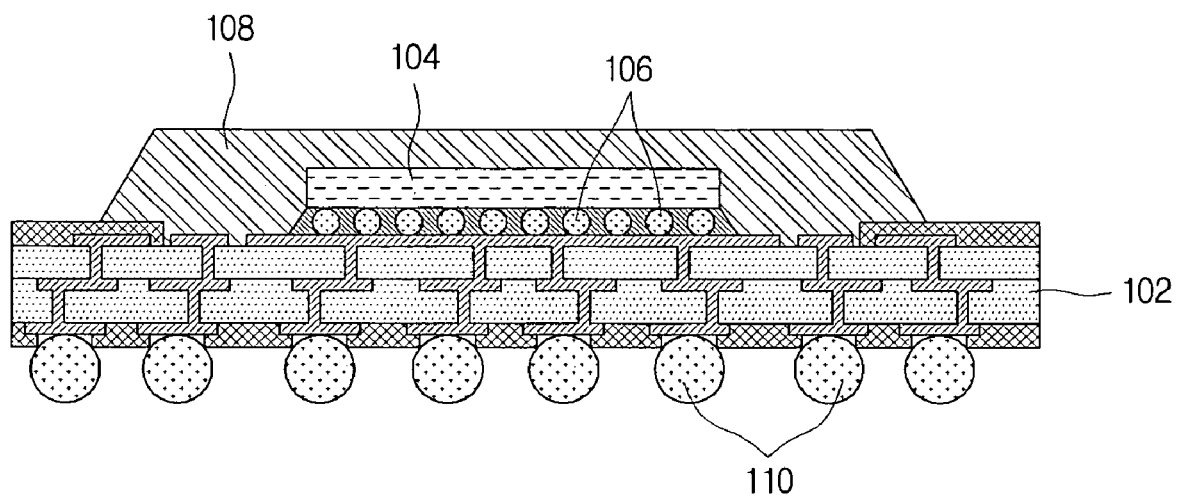
FIG. 1 is a cross-sectional view of a semiconductor chip package according to the related art.

As the invention allows for various changes and numerous embodiments, particular embodiments will be illustrated in drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

While such terms as "first," "second," etc., may be used to describe various elements, such elements must not be limited to the above terms. The above terms are used only to distinguish one element from another.

The terms used in the present application are merely used to describe particular embodiments, and are not intended to limit the present invention. An expression used in the singular encompasses the expression of the plural, unless it has a clearly different meaning in the context. In the present application, it is to be understood that the terms such as "including" or "having," etc., are intended to indicate the existence of the features, numbers, steps, actions, elements, parts, or combinations thereof disclosed in the specification, and are not intended to preclude the possibility that one or more other features, numbers, steps, actions, elements, parts, or combinations thereof may exist or may be added.

The heat-releasing printed circuit board and semiconductor chip package according to certain embodiments of the invention will be described below in more detail with reference to the accompanying drawings, in which those elements are rendered the same reference numeral that are the same or are in correspondence, regardless of the figure number, and redundant explanations are omitted.

Figure 2:
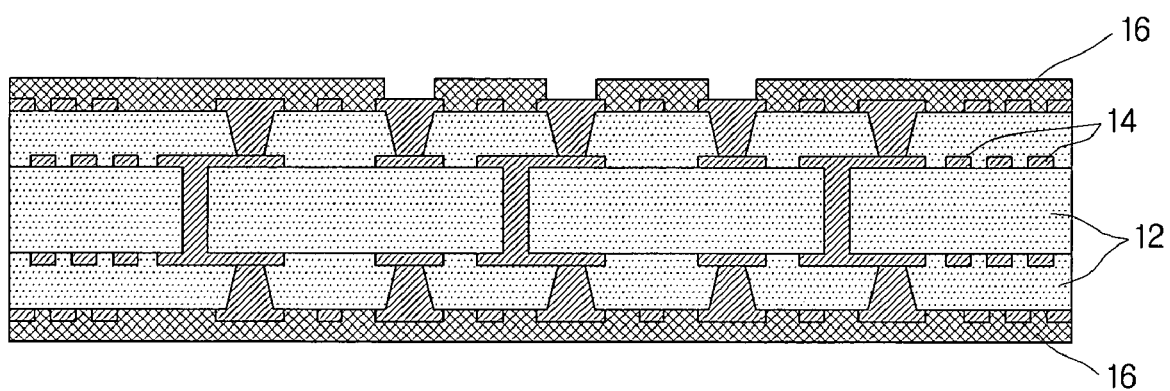
FIG. 2 is a cross-sectional view of a heat-releasing printed circuit board according to an embodiment of the invention.

FIG. 2 is a cross-sectional view of a heat-releasing printed circuit board according to an embodiment of the invention. In FIG. 2, there are illustrated insulation layers 12, circuit patterns 14, and solder resists 16.

This particular embodiment of the invention may include insulation layers 12, on the surfaces of which circuit patterns 14 are formed, and solder resists 16, stacked on the insulation layers 12, and may have carbon nanotubes contained in the solder resists 16, whereby heat generated in a semiconductor chip can be dispersed in several directions of the board, so that heat-releasing performance can be improved.

In a semiconductor chip package, the heat generated in the semiconductor chip due to the operation of the electronic product may travel through the conductive solder bumps and circuit patterns 14 to the board. The heat that has arrived at the board may be released through the broad areas of the board to the external environment.

However, the outermost layers of the insulation layers 12 in a printed circuit board are coated with the solder resists 16, which protect the circuit patterns 14 of the board from the external environment and prevent undesired contacts when mounting a component. The solder resist 16 is typically of an epoxy-based polymer, which has a very low thermal conductivity of about 0.23 W/m·K and a very high electrical resistivity of about $4 \, E^{12}$ Ωcm. As such, this is a material which poses one of the greatest obstacles to heat transfer, and which prevents the high levels of heat generated in the semiconductor chip from readily being released.

Therefore, in this embodiment, carbon nanotubes, made of chains of carbon atoms, are contained in the solder resists 16, so that the heat within the board can be emitted in several directions. A carbon nanotube is a new material, in which hexagon shapes made of six carbon atoms are connected together in a tubular form. The carbon nanotube has a thermal conductivity of 3,000 to 6,000 W/m·K, which is extremely high when considering that the thermal conductivities of copper and aluminum, commonly known to provide superb thermal conduction, are 350 W/m·K and 210 W/m·K, respectively. In particular, a carbon nanotube can provide directionality in heat transfer according to the structure of the chain, and thus can be very advantageous in narrow spaces such as in a package.

For the solder resists 16, which as mentioned above can be one of the greatest obstacles to heat transfer in a printed circuit board, the content of carbon nanotubes can be minimized such that the electrical resistivity is not significantly changed. In this way, the insulating quality of the solder resists 16 can be maintained, while the thermal dispersion performance of the printed circuit board can be improved.

The manufacture of the solder resist 16 containing carbon nanotubes may include inserting 0.1 to 1 parts by weight of the carbon nanotubes per 100 parts by weight of the solder resist 16, such that the electrical resistivity of the solder resists 16 is not significantly changed. Methods such as ultrasonication, ball milling, high speed shearing, chemical reforming, etc., can be used to evenly distribute the chemical nanotubes.

A thermal analysis was performed for a board coated with regular solder resists that do not contain carbon nanotubes, after mounting fifteen semiconductor chips. The results indicated a maximum temperature of 113.6° C. around the semiconductor chips, while the temperature of the surrounding solder resist 16 was about 20.2° C. This reveals that the high levels of heat generated in the semiconductor chips were not dispersed to the surroundings, due to the low thermal conductivity of the solder resist.

Conversely, a thermal analysis was performed for a board coated with solder resists 16 that contain carbon nanotubes in 0.2 parts by weight per 100 parts by weight of the solder resist 16, after mounting fifteen semiconductor chips as before. The results indicated a temperature of about 39.2° C. around the semiconductor chips, while the temperature of the surrounding solder resist 16 was about 30.1° C., revealing that heat was dispersed rapidly due to the solder resists 16 containing carbon nanotubes. As such, the inclusion of only a small amount of carbon nanotubes, such that has almost no impact on electrical resistivity, can provide a superb heat-releasing effect.

There can be multiple insulation layers 12 stacked, and the solder resists 16 containing carbon nanotubes may be stacked on the outermost layers of the multiple insulation layers 12. That is, by stacking solder resists 16 containing carbon nanotubes on the outermost layers of a multilayer printed circuit board, the heat-releasing property of the board can be improved.

In addition, to further improve the heat-releasing property of the board, carbon nanotubes can be incorporated not only in the solder resists 16 but also in the insulation layers 12. In such cases, the carbon nanotubes can be used in 0.1 to 1 parts by weight per 100 parts by weight of the insulation layer 12. As the distribution of the carbon nanotubes can be important in improving the heat-releasing property of the insulation layers 12, the carbon nanotubes can be distributed throughout the insulation layers 12 according to one of the methods described above.

Using the carbon nanotubes in the insulation layers 12 or solder resists 16 can improve the heat-releasing property of the insulation layers 12, and as a result, problems of warpage during the manufacturing process or in use can be improved. The thinner the thickness of the board, the greater the risk of warpage. To resolve this problem of warpage, developments in the related art were geared towards increasing the stiffness of the core. However, using a small amount of carbon nanotubes in the solder resists 16 or insulation layers 12, according to the spirit of the present invention, can greatly reduce warpage without degrading workability in processing holes. As warpage can be controlled without the use of a core, embodiments of the invention can be applied also to coreless structures, which are currently gaining attention.

Furthermore, by using a small amount of carbon nanotubes in the solder resists 16 or insulation layers 12, the thermal conductivity can be greatly increased with very little change in the coefficient of thermal expansion. Thus, as the high levels of heat can be dispersed in a short period of time, the curing times of the solder resists 16 or insulation layers 12 can be reduced.

Figure 3:
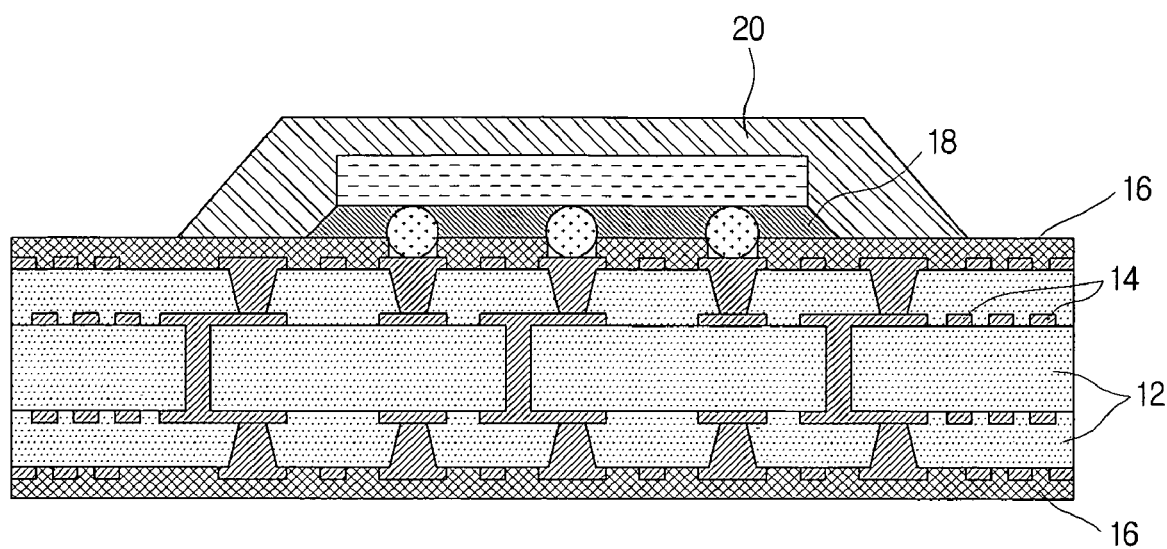
FIG. 3 is a cross-sectional view of a semiconductor chip package according to an embodiment of the invention.

FIG. 3 is a cross-sectional view of a semiconductor chip package according to an embodiment of the invention. In FIG. 3 are illustrated insulation layers 12, circuit patterns 14, solder resists 16, an underfill 18, and a molding material 20.

The semiconductor chip package may have a semiconductor chip mounted on a printed circuit board by way of solder bumps, etc., and may have an attach film or underfill 18 applied between the semiconductor chip and the printed circuit board to increase the adhesion between the semiconductor chip and printed circuit board. When the semiconductor chip is mounted on the printed circuit board, a molding material 20 can be coated which encapsulates the semiconductor chip. Furthermore, in order to mount this semiconductor chip package onto a main board, solder balls may be coupled, and the semiconductor chip can be mounted on the main board by a flip chip method, etc.

Looking at the path through which the heat generated in the semiconductor chip travels in the semiconductor chip package, the heat generated in the semiconductor chip may travel through the solder bumps and the circuit patterns 14 of the board to the solder balls connected to the main board. As such, the paths of heat flow can be quite limited, and thus high levels of heat can be generated in the semiconductor chip or board, causing defects such as malfunctioning or halting, etc.

This particular embodiment of the invention may include a semiconductor chip, insulation layers 12, on which the semiconductor chip is mounted and on the surfaces of which circuit patterns 14 are formed, and solder resists 16, stacked on the insulation layers 12, where carbon nanotubes may be contained in the solder resists 16. Thus, heat generated in a semiconductor chip can be dispersed in several directions of the board, so that heat-releasing performance can be improved.

The manufacture of the solder resist 16 containing carbon nanotubes may include inserting 0.1 to 1 parts by weight of the carbon nanotubes per 100 parts by weight of the solder resist 16, such that the electrical resistivity of the solder resists 16 is not significantly changed. Methods such as ultrasonication, ball milling, high speed shearing, chemical reforming, etc., can be used to evenly distribute the chemical nanotubes.

There can be multiple insulation layers 12 stacked, and the solder resists 16 containing carbon nanotubes may be stacked on the outermost layers of the multiple insulation layers 12. That is, by stacking solder resists 16 containing carbon nanotubes on the outermost layers of a multilayer printed circuit board, the heat-releasing property of the board can be improved.

To further improve the heat-releasing property of the board, carbon nanotubes can be incorporated not only in the solder resists 16 but also in the insulation layers 12. In such cases, the carbon nanotubes can be used in 0.1 to 1 parts by weight per 100 parts by weight of the insulation layer 12. As the distribution of the carbon nanotubes can be important in improving the heat-releasing property of the insulation layers 12, the carbon nanotubes can be distributed throughout the insulation layers 12 according to one of the methods described above.

In certain cases, an underfill 18 may additionally be applied between the semiconductor chip and the insulation layer 12, where the underfill 18 may contain carbon nanotubes. By injecting a liquid underfill 18, or by using an underfill 18 in the form of a film, the adhesion between the semiconductor chip and the board can be increased, for greater reliability. In such cases, carbon nanotubes can be incorporated in the liquid underfill 18 or film underfill 18, so that the heat generated from the semiconductor chip can readily be transferred to the board. The content of carbon nanotubes in the underfill 18 can be 0.1 to 1 parts by weight per 100 parts by weight of the underfill 18. As the distribution of the carbon nanotubes can be important in improving the heat-releasing property of the underfill 18, the carbon nanotubes can be distributed throughout the underfill 18 according to one of the methods described above.

Furthermore, after the semiconductor chip is mounted on the board, a molding material 20 that encapsulates the semiconductor chip can be coated, where carbon nanotubes can be incorporated in this molding material 20 also, to improve the heat-releasing property of the semiconductor chip package. In these cases also, the content of carbon nanotubes in the molding material 20 can be 0.1 to 1 parts by weight per 100 parts by weight of the molding material 20. As the distribution of the carbon nanotubes can be important in improving the heat-releasing property of the molding material 20, the carbon nanotubes can be distributed throughout the molding material 20 according to one of the methods described above.

Whereas the heat generated in a semiconductor chip is typically transferred to the board and released through the board to the external environment, by incorporating carbon nanotubes in the molding material 20, the heat may be emitted not only through the board but also through the molding material 20, so that the high levels of heat generated in the semiconductor chip can be released to the external environment through numerous paths.

As described above, carbon nanotubes can be incorporated in the solder resists 16, insulation layers 12, underfill 18, or molding material 20, which act as obstacles to the transfer of heat generated in a semiconductor chip, whereby the heat generated in a semiconductor chip package can be released through numerous different paths, to improve the heat-releasing property of the package.

According to certain aspects of the invention as set forth above, heat generated in a semiconductor chip can be dispersed in several directions of a board or package, to improve heat-releasing property.

Also, certain aspects of the invention can reduce warpage that may occur in the board during the manufacturing process or during use due to differences in the coefficient of thermal expansion of the insulation material, solder resist, etc., forming a printed circuit board.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. A heat-releasing printed circuit board comprising:
an insulation layer having a circuit pattern formed on a surface thereof; and
a solder resist stacked on the insulation layer,
wherein the solder resist contains carbon nanotubes, and the content of the carbon nanotubes in the solder resist is 0.1 to 1 parts by weight of the carbon nanotubes per 100 parts by weight of the solder resist.

2. The heat-releasing printed circuit board according to claim 1, wherein a plurality of insulation layers are stacked, and the solder resist is stacked on at least one of the outermost layers of the plurality of insulation layers.

3. The heat-releasing printed circuit board according to claim 1, wherein the insulation layer contains carbon nanotubes.

4. The heat-releasing printed circuit board according to claim 3, wherein the content of the carbon nanotubes in the insulation layer is 0.1 to 1 parts by weight of the carbon nanotubes per 100 parts by weight of the insulation layer.

5. A semiconductor chip package comprising:
a semiconductor chip;
an insulation layer configured to have the semiconductor chip mounted thereon and having a circuit pattern formed on a surface thereof; and
a solder resist stacked on the insulation layer,
wherein the solder resist contains carbon nanotubes.

6. The semiconductor chip package according to claim 5, wherein a plurality of insulation layers are stacked, and the solder resist is stacked on at least one of the outermost layers of the plurality of insulation layers.

7. The semiconductor chip package according to claim 5, wherein the content of the carbon nanotubes in the solder resist is 0.1 to 1 parts by weight of the carbon nanotubes per 100 parts by weight of the solder resist.

8. The semiconductor chip package according to claim 5, wherein the insulation layer contains carbon nanotubes.

9. The semiconductor chip package according to claim 8, wherein the content of the carbon nanotubes in the insulation layer is 0.1 to 1 parts by weight of the carbon nanotubes per 100 parts by weight of the insulation layer.

10. The semiconductor chip package according to claim 5, wherein an underfill is interposed between the semiconductor chip and the insulation layer,
and wherein the underfill contains carbon nanotubes.

11. The semiconductor chip package according to claim 10, wherein the content of the carbon nanotubes in the underfill is 0.1 to 1 parts by weight of the carbon nanotubes per 100 parts by weight of the insulation layer.

12. The semiconductor chip package according to claim 5, further comprising:
a molding material encapsulating the semiconductor chip,
wherein the molding material contains carbon nanotubes.

13. The semiconductor chip package according to claim 12, wherein the content of the carbon nanotubes in the molding material is 0.1 to 1 parts by weight of the carbon nanotubes per 100 parts by weight of the insulation layer.

14. A heat-releasing printed circuit board comprising:
an insulation layer having a circuit pattern formed on a surface thereof; and
a solder resist stacked on the insulation layer,
wherein the solder resist and the insulation layer contain carbon nanotubes, and the content of the carbon nanotubes in the insulation layer is 0.1 to 1 parts by weight of the carbon nanotubes per 100 parts by weight of the insulation layer.

* * * * *